US 7,778,621 B2

(12) United States Patent
Tandy (10) Patent No.: US 7,778,621 B2
(45) Date of Patent: *Aug. 17, 2010

(54) METHODS OF OPERATING ELECTRONIC DEVICES, AND METHODS OF PROVIDING ELECTRONIC DEVICES

(75) Inventor: Patrick W. Tandy, Boise, ID (US)

(73) Assignee: Round Rock Research, LLC, Mount Kisco, NY (US)

( * ) Notice: Subject to any disclaimer, the term of this patent is extended or adjusted under 35 U.S.C. 154(b) by 9 days.

This patent is subject to a terminal disclaimer.

(21) Appl. No.: 11/847,645

(22) Filed: Aug. 30, 2007

(65) Prior Publication Data

US 2007/0298730 A1 Dec. 27, 2007

Related U.S. Application Data

(63) Continuation of application No. 11/512,783, filed on Aug. 29, 2006, which is a continuation of application No. 10/793,173, filed on Mar. 3, 2004, now Pat. No. 7,107,019, which is a continuation of application No. 10/371,123, filed on Feb. 19, 2003, now Pat. No. 6,718, 163, which is a continuation of application No. 09/260, 997, filed on Mar. 1, 1999, now Pat. No. 6,542,720.

(51) Int. Cl.
*H04B 1/38* (2006.01)
*H04B 1/00* (2006.01)

(52) U.S. Cl. .................... 455/333; 455/90.3; 455/343.1; 455/573; 455/575.1; 320/101; 343/701

(58) Field of Classification Search ................ 455/333, 455/90.3, 575.1, 550.1, 90.2, 575.8, 334, 455/351, 73, 80, 83, 88, 41.2, 128–129, 347–348, 455/343.6, 344, 90.1, 292, 41.1, 127.1, 127.5, 455/343.1; 257/723–725, 700, 712, 728, 257/778, 679, 924; 340/825.32; 342/42–44; 343/701–703; 320/101–102, 124, 127, 137–138
See application file for complete search history.

(56) References Cited

U.S. PATENT DOCUMENTS 3,651,434 A 3/1972 McGeough et al. ......... 333/247

(Continued)

FOREIGN PATENT DOCUMENTS

JP 2000-223656 8/2000

OTHER PUBLICATIONS

USPTO Transaction History of U.S. Appl. No. 09/260,997, filed Mar. 1, 1999, entitled "Microelectronic Devices, Methods of Operating Microelectronic Devices, and Methods of Providing Microelectronic Devices," now U.S. Patent No. 6,542,720.

(Continued)

*Primary Examiner*—Pablo N Tran
(74) *Attorney, Agent, or Firm*—Lerner, David, Littenberg, Krumholz & Mentlik, LLP (57) ABSTRACT

Some embodiments include a method disposing an integrated circuit die within a housing, the integrated circuit die having integrated circuitry formed thereon, the integrated circuitry including first transponder circuitry configured to transmit and receive radio frequency signals, wherein the integrated circuit die is void of external electrical connections for anything except power supply external connections; and disposing second transponder circuitry, discrete from the first transponder circuitry, within the housing, the second transponder circuitry being configured to transmit and receive radio frequency signals, wherein the first and second transponder circuitry are configured to establish wireless communication between one another within the housing, the second transponder circuitry being disposed within 24 inches of the first transponder circuitry within the housing.

34 Claims, 3 Drawing Sheets

U.S. PATENT DOCUMENTS

| | | | |
|---|---|---|---|
| 3,936,864 A | 2/1976 | Benjamin | 257/664 |
| 5,117,068 A | 5/1992 | Seieroe et al. | 174/536 |
| 5,313,211 A | 5/1994 | Tokuda et al. | 342/50 |
| 5,337,063 A | 8/1994 | Takahira | 343/741 |
| 5,340,968 A * | 8/1994 | Watanabe et al. | 235/380 |
| 5,347,263 A | 9/1994 | Carroll et al. | 340/5.61 |
| 5,497,140 A | 3/1996 | Tuttle | 340/10.1 |
| 5,563,086 A | 10/1996 | Bertin et al. | 438/15 |
| 5,621,913 A | 4/1997 | Tuttle et al. | 455/41.12 |
| 5,629,838 A | 5/1997 | Knight et al. | |
| 5,692,298 A | 12/1997 | Goetz et al. | 29/848 |
| 5,734,198 A | 3/1998 | Stave | 257/666 |
| 5,736,783 A | 4/1998 | Wein et al. | 257/691 |
| 5,751,820 A | 5/1998 | Taenzer | 381/312 |
| 5,754,948 A * | 5/1998 | Metze | 455/41.2 |
| 5,757,074 A | 5/1998 | Matloubian et al. | 257/702 |
| 5,763,945 A | 6/1998 | Corisis et al. | 257/692 |
| 5,818,105 A | 10/1998 | Kouda | 257/696 |
| 5,842,118 A | 11/1998 | Wood, Jr. | 455/101 |
| 5,903,050 A | 5/1999 | Thurairajaratnam et al. | 257/695 |
| 5,903,168 A | 5/1999 | Yang et al. | 326/86 |
| 6,013,949 A | 1/2000 | Tuttle | 257/723 |
| 6,023,610 A | 2/2000 | Wood, Jr. | 455/101 |
| 6,031,459 A | 2/2000 | Lake | 340/572.8 |
| 6,060,342 A | 5/2000 | Montauti et al. | 438/125 |
| 6,078,791 A | 6/2000 | Tuttle et al. | 455/90.1 |
| 6,140,697 A | 10/2000 | Usami et al. | 257/691 |
| 6,168,084 B1 | 1/2001 | Mish | 35/492 |
| 6,169,295 B1 | 1/2001 | Koo | 257/81 |
| 6,170,748 B1 | 1/2001 | Hash et al. | 235/451 |
| 6,172,425 B1 | 1/2001 | Steijer et al. | 257/787 |
| 6,175,124 B1 | 1/2001 | Cole et al. | 257/48 |
| 6,180,433 B1 | 1/2001 | Furey et al. | 438/106 |
| 6,184,060 B1 | 2/2001 | Siniaguine | 438/106 |
| 6,263,193 B1 * | 7/2001 | Iseki et al. | 455/84 |
| 6,335,669 B1 | 1/2002 | Miyazaki et al. | 333/247 |
| 6,480,699 B1 | 11/2002 | Lovoi | 455/41.2 |
| 6,496,889 B1 | 12/2002 | Perino et al. | 710/110 |
| 6,512,431 B2 * | 1/2003 | Pergande | 333/246 |
| 6,542,720 B1 | 4/2003 | Tandy | 455/90.3 |
| 6,563,464 B2 | 5/2003 | Ballantine et al. | 343/700 MS |
| 6,646,554 B1 | 11/2003 | Goff et al. | 340/572.6 |
| 6,718,163 B2 | 4/2004 | Tandy | 455/90.2 |
| 6,856,788 B2 * | 2/2005 | Chang et al. | 455/41.1 |
| 6,873,259 B2 * | 3/2005 | Teraura | 340/572.1 |
| 6,942,157 B2 * | 9/2005 | Nozawa et al. | 235/492 |
| 6,967,347 B2 * | 11/2005 | Estes et al. | 257/25 |
| 7,088,964 B2 * | 8/2006 | O | 455/90.3 |
| 7,107,019 B2 | 9/2006 | Tandy | |
| 7,126,151 B2 * | 10/2006 | Estes et al. | 257/25 |
| 7,330,702 B2 * | 2/2008 | Chen et al. | 455/73 |
| 7,379,713 B2 * | 5/2008 | Lindstedt | 455/90.3 |
| 7,593,708 B2 | 9/2009 | Tandy | |
| 2006/0271112 A1 * | 11/2006 | Martinson et al. | 607/2 |
| 2006/0293019 A1 | 12/2006 | Tandy | |

OTHER PUBLICATIONS

USPTO Transaction History of U.S. Appl. No. 10/371,123, filed Feb. 19, 2003, entitled "Methods of Operating Microelectronic Devices, and Methods of Providing Microelectronic Devices," now U.S. Patent No. 6,718,163.

USPTO Transaction History of U.S. Appl. No. 10/793,173, filed Mar. 3, 2004, entitled "Methods of Operating Microelectronic Devices, and Methods of Providing Microelectronic Devices," now U.S. Patent No. 7,107,019.

USPTO Transaction History of U.S. Appl. No. 11/512,783, filed Aug. 29, 2006, entitled "Methods of Operating Microelectronic Devices, and Methods of Providing Microelectronic Devices.".

* cited by examiner

_Fig. 1_

_Fig. 2_

_Fig. 3_

METHODS OF OPERATING ELECTRONIC DEVICES, AND METHODS OF PROVIDING ELECTRONIC DEVICES

CROSS REFERENCE TO RELATED PATENT DATA

This is a continuation of U.S. patent application Ser. No. 11/512,783, filed Aug. 29, 2006, entitled "Methods of Operating electronic Devices, and Methods of Providing Electronic Devices", naming Patrick W. Tandy as inventor, which is a continuation of U.S. patent application Ser. No. 10/793,173, filed Mar. 3, 2004, now U.S. Pat. No. 7,107,019, which is a continuation of U.S. patent application Ser. No. 10/371,123, filed Feb. 19, 2003, now U.S. Pat. No. 6,718,163, which in turn is a continuation of U.S. patent application Ser. No. 09/260,997, filed Mar. 1, 1999, now U.S. Pat. No. 6,542,720 B1, and the disclosures of which are incorporated herein by reference.

TECHNICAL FIELD

The technical field is electronic devices, methods of operating electronic devices, and methods of forming electronic devices.

BACKGROUND

As semiconductor integrated circuit (IC) devices continue to shrink in dimension, challenges are posed with respect to packaging the integrated circuitry into microelectronic devices. In some prior art integrated circuitry device, individual IC chips (die) are connected to inner leads of a lead frame by wire bonds. The chip, wire bonds, and inner leads are completely encapsulated for protection with a substance such as plastic or ceramic. Outer leads communicate with the inner leads of the lead frame, but the outer leads typically remain exposed for mounting of the packaged device to external circuitry, such as a printed circuit board. Exemplary constructions are disclosed in U.S. Pat. Nos. 5,734,198, 5,736,783, 5,763,945, 5,818,105 5,117,068, and 5,692,298, the disclosures of which are incorporated by reference herein.

In a conventional construction, a semiconductor die is placed on and bonded to a center die paddle of a lead frame for support. Inner lead fingers of the lead frame are disposed proximate the paddle but do not contact or communicate with the paddle. Rather, wire bonds communicate between contact pads (terminals) on the die and the inner lead fingers of the lead frame by spanning a gap between the die and the fingers. The wire bonds allow for the transmission of electrical signals between the die and the lead frame. The lead fingers allow the chip or die to be electrically connected with other chips or die for providing an operable microelectronic device.

Wire bonds can be problematic for a number of different reasons. First, additional processing steps are needed to ensure that the wire bonds are adequately formed between the lead frame and bond pads on the integrated circuit die. Such processing requires precise placement of the wire bonds or the operation of the integrated circuit die can be compromised. Additionally, because wire bonds are typically very thin electrical connections they can become disconnected and cause operational failure of the finished device.

Accordingly, this invention arose out of concerns associated with providing improved microelectronic devices and methods of forming the same which reduce processing complexities and provide for improved performance.

DETAILED DESCRIPTION OF THE ILLUSTRATED EMBODIMENTS

Figure 1:
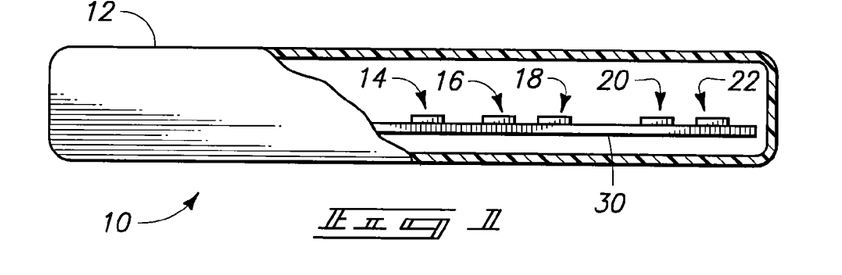
FIG. 1 is a side elevational view of a microelectronic device in accordance with one embodiment of the invention, with a portion having been broken away for clarity.

Referring to FIGS. 1-5, and particularly to FIG. 1, an exemplary microelectronic device in accordance with one embodiment of the invention is shown generally at 10. The term "microelectronic device" as used in this document will be understood to include, without limitation, integrated circuit devices which are resident on a single die or chip, or a collection of die or chips arranged into an operable integrated circuit configuration. Device 10 includes a microelectronic package 12 which provides a housing within which integrated circuitry is received. The term "microelectronic package" will be understood to mean a housing or container within which integrated circuitry is received to provide a microelectronic device. By way of example only, example microelectronic packages include product containers such as computer hard drive housings, cellular phone housings, and other handheld electronic device housings. Such microelectronic packages need not, however, be hand-held. In addition, microelectronic packages can include self-contained hermetically-sealed packages such as those which conventionally contain integrated circuit die. Such packages can be formed from plastic, ceramic, or any other suitable material.

In FIG. 1, a portion of package 12 has been broken away for clarity. An integrated circuit die 14 is received within microelectronic package 12 and has integrated circuitry formed thereon. In this example, package 12 includes individual die 16, 18, 20, and 22 which have been prepackaged into individual respective integrated circuit chips which contain integrated circuitry which can be or is electrically connected into an operative arrangement.

Figure 2:
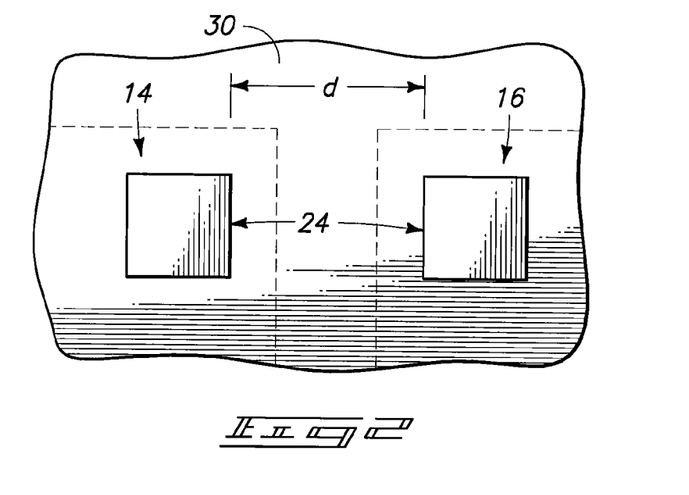
FIG. 2 is a top plan view of a portion of a microelectronic device in accordance with one embodiment of the invention.

In FIG. 2, a top plan view of die 14, 16 is shown. The dashed lines which bound the individual die are intended to represent the exterior of a die or chip container. In a preferred embodiment, one of the integrated circuit die, e.g. die 14, includes integrated circuitry 24 (FIG. 4) having first transmit/receive circuitry 26 configured to transmit and receive radio frequency signals. Second transmit/receive circuitry (such as circuitry 26) is provided which is preferably discrete from first transmit/receive circuitry 26. Such second transmit/receive circuitry can be received or supported by die 16. Accordingly, the second transmit/receive circuitry is contained within microelectronic package 12 and is configured to transmit and receive radio frequency signals.

In a preferred embodiment, the first and second transmit/receive circuitry 26 are configured to establish wireless communication between one another within the microelectronic package. In one embodiment, second transmit/receive circuitry (such as circuitry 26b in FIG. 5) is disposed on a second integrated circuit die such as die 14b. In another embodiment, the microelectronic device further includes a substrate 30 (FIGS. 1 and 2) disposed within the housing and supporting the first and second transmit/receive circuitry 26. Any suitable material can be used for substrate 30 with exemplary substrates including a printed circuit board.

In one embodiment, microelectronic devices can be provided which are small in size, such as those which can be hand-carried or transported. In another embodiment, the integrated circuitry comprising the first and second transmit/receive circuitry 26 are disposed within 24 inches of one another (distance d in FIG. 2) within the microelectronic package. In another embodiment (FIGS. 3-5), integrated circuitry 24 comprising the first and second transmit/receive circuitry 26 respectively, comprise individual respective antennas 32 (FIG. 5) which are configured to transmit and receive wireless communication. The antennas can be connected to their respective integrated circuitry 24 by a conductive trace of material (indicated as a dashed line extending between integrated circuitry 24 and antenna 32 in FIG. 3) over the die. Further augmentation can be provided by connecting the antenna to a lead finger, similar to lead fingers 34, 36 (FIG. 3) via a wire bond. In a preferred embodiment, the antennas are configured to transmit and receive wireless RF communication.

In one embodiment, antennas 32 (FIG. 5) are disposed within 24 inches of one another within the microelectronic package. In another embodiment, the antennas are disposed within one inch of one another within the microelectronic package. In yet another embodiment, the antennas are disposed within one-half inch of one another within the microelectronic package.

Figure 3:
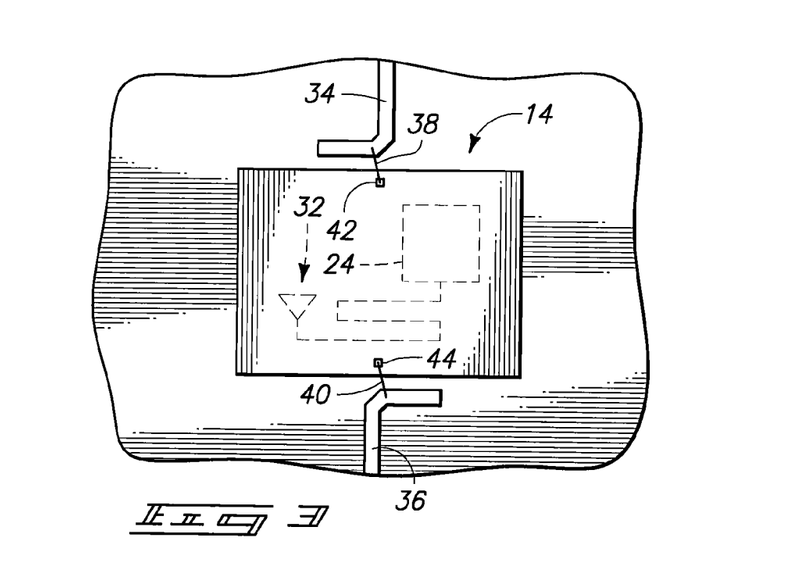
FIG. 3 is a top plan view of a portion of a microelectronic device in accordance with one embodiment of the invention.

In one embodiment, and one perhaps best shown in FIG. 3, die 14 is void of external electrical connections for anything other than at least one of power and ground. In the illustrated example, lead fingers 34, 36 are provided and are coupled electrically with die 14 via wire bonds 38, 40 respectively. The wire bonds connect with contact pads 42, 44 respectively on die 14 and provide the connections through which power and ground are established. These connections, in this example, constitute the only connections which are necessarily made through lead fingers to the outside world. Of course, other connections can be made through lead fingers which are not specifically illustrated.

Figure 4:
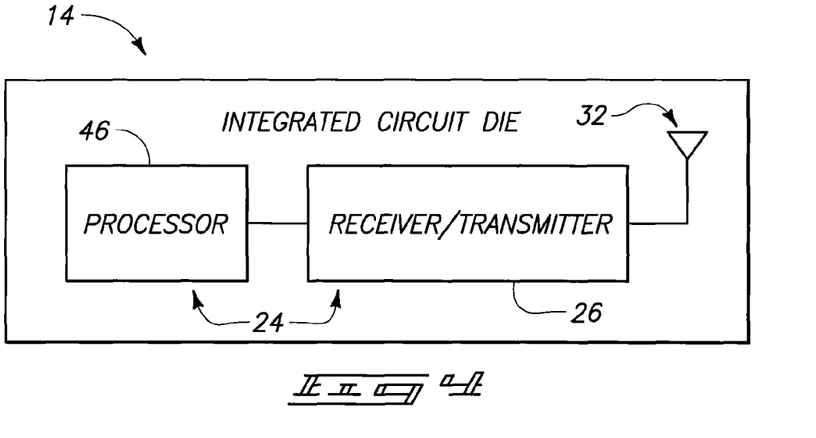
FIG. 4 is a high level block diagram of an integrated circuit die in accordance with one embodiment of the invention.
Figure 5:
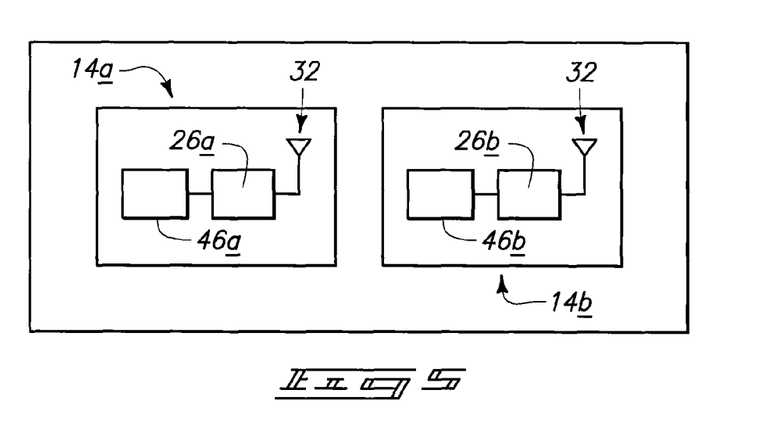
FIG. 5 is a high level block diagram of a microelectronic device in accordance with one embodiment of the invention.

Referring still to FIGS. 1-5, and in accordance with another embodiment, an integrated circuit die 14 is received within microelectronic package 12 and has integrated circuitry 24 thereon which is configured to operate in a designed manner. By "designed manner" is meant any manner in which integrated circuitry is conventionally able to operate. In this example, integrated circuitry 24 includes a processor 46 (FIG. 4), 46a, 46b (FIG. 5). Processor 46 can comprise any suitably formed or provided processor, e.g. a microprocessor, which is conventionally employed in integrated circuitry devices. FIG. 4 also shows integrated circuitry 24 as including a receiver/transmitter 26. Although this element is shown as a combination receiver/transmitter, it can comprise only a receiver or only a transmitter.

FIG. 5 shows an exemplary device which comprises two die 14a, 14b. These die are preferably part of and received inside of microelectronic package 12. An integrated circuitry transmitter 26a is provided and received within microelectronic package 12. The transmitter can, but need not have a companion receiver. The transmitter is preferably configured to transmit wireless communication. An integrated circuitry receiver 26b is provided and is received within microelectronic package 12. The receiver can, but need not have a companion transmitter. Receiver 26b is preferably configured to receive wireless communication which is transmitted by integrated circuitry transmitter 26a. In a preferred embodiment, receiver 26b is operably coupled with a processor 46b and configured to provide data to the processor responsive to received wireless communication. In one embodiment, receiver 26b comprises a portion of the integrated circuitry which is formed on die 14b. In another embodiment, integrated circuitry transmitter 26a is disposed on a second integrated circuit die. In another embodiment, more than one die is received within the housing, as shown best in FIG. 1. The plurality of die all may or may not be configured to communicate with one another.

Preferably, die 14a, 14b are configured in some applications to establish wireless communication between them in a manner which serves to eliminate most, if not all physical-electrical connections which were formerly employed to establish wireless communication therebetween. For example, and as prevalent in the prior art, individual die were connected, via suitable wire bonds, to lead frames which, in turn, established electrical communication with the outside world. In accordance with some of the inventive structures and methods, many of the wire bonds and lead fingers on the lead frames can be eliminated because now, functional communication between the separate die takes place through the transmission of wireless communication. Of course, in some embodiments, physical-electrical connection can be provided in order to supply desired die with suitable power and ground connections.

In one embodiment, the transmitter and the receiver are disposed within the microelectronic package within 24 inches of one another. In another embodiment, the transmitter and the receiver are disposed within the microelectronic package within one inch of one another. In another embodiment, the transmitter and receiver are disposed within the microelectronic package within one-half inch of one another.

Preferably, processor 46 is configured to receive data which is provided by receiver 26 and, responsive thereto, cause the integrated circuitry on die 14 to operate in the above-mentioned designed manner. In a preferred embodiment, the microelectronic device 10 is hand-transportable.

Referring still to FIGS. 1-5, and in accordance with another embodiment of the invention, a microelectronic device includes a microelectronic package 12 which provides a housing within which integrated circuitry is received. The microelectronic package preferably includes an integrated circuitry-supporting substrate 30 inside the housing. An integrated circuit die, e.g. any and/or all of die 14-22, is received within package 12 and supported by substrate 30. The die preferably has integrated circuitry formed thereon comprising first transmit/receive circuitry 26a (FIG. 5) configured to transmit and receive wireless communication. Second transmit/receive circuitry 26b is provided and is preferably discrete from first transmit/receive circuitry 26a. The second transmit/receive circuitry 26b is preferably contained within microelectronic package 12 and is configured to transmit and receive wireless communication. In this example, the first and second transmit/receive circuitry 26a, 26b are configured to establish wireless communication between one another within the microelectronic package 12 sufficient to enable the integrated circuitry on die 14 to operate in a designed manner. In one embodiment, the second transmit/receive circuitry is supported by the integrated circuit-supporting substrate 30. In another embodiment, the second transmit/receive circuitry 26b is disposed on a second integrated circuit die supported by the integrated circuitry-supporting substrate 30. In another embodiment, device 10 is hand-transportable.

In another embodiment, individual antennas 32 (FIG. 5) are provided and are operably associated with the first and second transmit/receive circuitry 26a, 26b respectively. In one embodiment, the antennas are disposed within 24 inches of one another. In another embodiment, the antennas are disposed within one inch of one another. In yet another embodiment, the antennas are disposed within one-half inch of one another.

Figure 6:
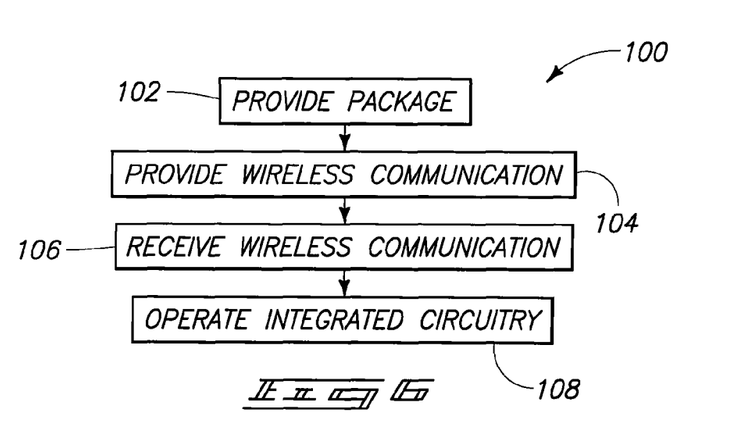
FIG. 6 is a flow diagram which describes one embodiment of the present invention.

Referring to FIG. 6, and in accordance with another embodiment of the invention, a method of operating a microelectronic device is shown generally at 100 and includes at 102, providing a microelectronic package having housed therein integrated circuitry. At 104, wireless communication is produced using a transmitter inside of the microelectronic package. At 106, the produced wireless communication is received using a receiver inside the microelectronic package. At 108, and responsive to the receiving of the wireless communication, the integrated circuitry within the microelectronic package is caused to operate in a designed manner. In one embodiment, the production of wireless communication at 104 takes place through the use of an integrated circuitry transmitter. In another embodiment, the receipt of such wireless communication takes place through the use of an integrated circuitry receiver. Other embodiments further comprise positioning the transmitter and the receiver inside the microelectronic package within 24 inches, one inch, and one-half inch respectively, of one another. In yet another embodiment, provision of the integrated circuitry within the microelectronic package comprises fabricating the circuitry.

Figure 7:
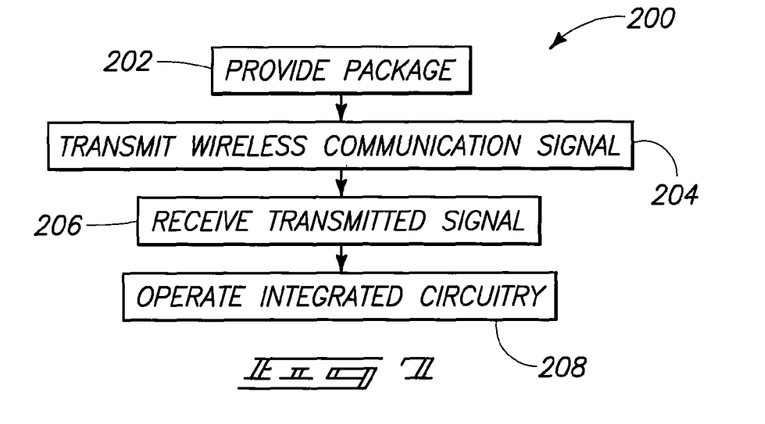
FIG. 7 is a flow diagram which describes one embodiment of the present invention.

Referring to FIG. 7, and in accordance with another embodiment of the invention, a method of operating a microelectronic device is shown generally at 200 and includes, at 202, providing a microelectronic package having housed therein integrated circuitry. At 204, a wireless communication signal is transmitted using an integrated circuitry transmitter inside the microelectronic package. At 206, the transmitted wireless communication signal is received using an integrated circuitry receiver inside the microelectronic package. At 208, and responsive to receiving the wireless communication signal, the integrated circuitry within the microelectronic package is caused to operate in a designed manner. In one embodiment, the transmitter and the receiver are positioned within 24 inches of one another. In other embodiments, the transmitter and the receiver are positioned within one inch and one-half inch respectively, of one another. Further aspects of the invention include fabricating one of the integrated circuitry transmitter or receiver, or preferably both.

Figure 8:
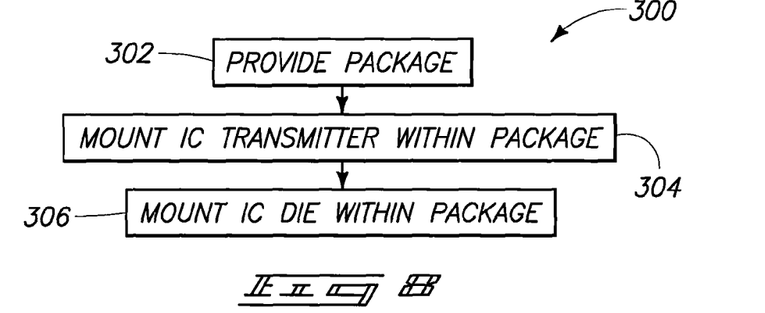
FIG. 8 is a flow diagram which describes one embodiment of the present invention.

Referring to FIG. 8, and in accordance with another embodiment of the invention, a method of providing a microelectronic device is shown generally at 300 and includes at 302 providing a microelectronic package within which integrated circuitry is to be housed. At 304, an integrated circuitry transmitter is mounted within the package. At 306, an integrated circuit die is mounted within the package and includes integrated circuitry disposed thereon. The integrated circuitry preferably includes an integrated circuit receiver, wherein the transmitter and the receiver are configured to establish direct wireless communication with one another. Preferably, the wireless communication permits operating instructions for the integrated circuitry on the die to be transmitted and received within the microelectronic package. In one embodiment, the transmitter and the receiver are mounted within 24 inches of one another. In another embodiment the transmitter and the receiver are mounted within one inch of one another. In yet another embodiment, the transmitter and the receiver are mounted within one-half inch of one another.

Figure 9:
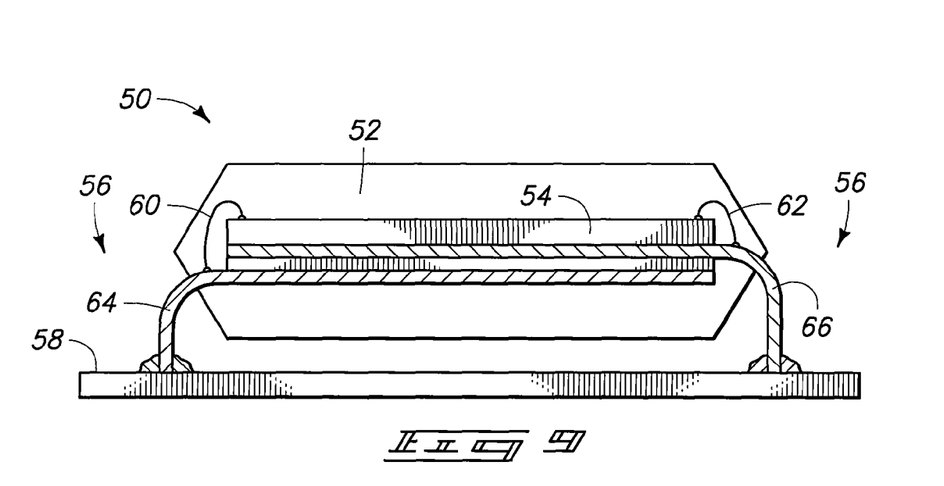
FIG. 9 is a side elevational view of a microelectronic device in accordance with one embodiment of the invention.

Referring to FIG. 9, an exemplary microelectronic device is shown generally at 50 and includes a microelectronic package 52. Package 52 contains and supports an integrated circuit die 54. Physical-electrical connection structure is provided and shown generally at 56, and secures die 54 to an integrated circuitry-supporting substrate 58. The physical-electrical connection structure provides both electrical and physical connections between circuit die 54 and outside world circuitry. In this embodiment, physical-electrical connection structure 56 supplies electrical connections only for power and ground. In this specific example, the physical-electrical connection structure includes respective wire bonds 60, 62 which are individually and respectively connected with lead fingers 64, 66.

Advantages of various embodiments of the invention include a reduction in the number wire bonds necessary to impart functionality to a microelectronic device. Relatedly, the number of processing steps which are needed to ensure that wire bonds are adequately formed between a lead frame and bond pads on an integrated circuit die can be reduced. Hence, risks which were formerly associated with wire bonds becoming detached because of the very thin nature of such connections can be reduced. Various embodiments of the invention can provide improved microelectronic devices and methods of forming the same which reduce processing complexities and provide for improved performance.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A cellular phone housing comprising:
    a first die mounted on a substrate, the first die having first transmit and receive circuitry configured to transmit and receive radio frequency signals via a first antenna; and
    a second die mounted on the substrate, the second die discrete from the first die and having second transmit and receive circuitry configured to transmit and receive radio frequency signals via a second antenna;
    wherein the first die, the second die, and the substrate are all contained within the cellular phone housing, at least one of the first die and the second die void of electrical interconnects that carry communication signals between each other;
    wherein the first transmit and receive circuitry and the second transmit and receive circuitry are configured to establish a wireless communications link between the first and second die, and wherein there is no communication between the first and second die other than via a wireless communications link; and
    wherein electronic connections between the first and second die and the substrate are power connections only.

2. The cellular phone housing of claim 1, wherein the first die is mounted on the substrate within twenty-four inches of the second die.

3. The cellular phone housing of claim 1, wherein the first die is mounted on the substrate within one inch of the second die.

4. The cellular phone housing of claim 1, wherein the first die is mounted on the substrate within one-half inch of the second die.

5. The cellular phone housing of claim 1, wherein the cellular phone housing is hand-transportable.

6. The cellular phone housing of claim 1, further comprising:
a first processor formed on the first die, the first processor coupled to the first transmit and receive circuitry; and
a second processor formed on the second die, the second processor coupled to the second transmit and receive circuitry.

7. The cellular phone housing of claim 1 wherein the cellular phone housing is handheld.

8. The cellular phone housing of claim 1 wherein the cellular phone housing is formed from plastic.

9. A microelectronic device, comprising:
a cellular phone housing; and
a plurality of die mounted on a substrate within the cellular phone housing, each of the plurality of die having a processor and transceiver circuitry coupled to the processor, wherein an antenna is coupled to the transceiver circuitry;
physical connections to each of the plurality of die, wherein the physical connections provide only power connections to the die;
wherein the transceiver circuitry on each of the die is configured to establish wireless communications links among individual ones of the die, and wherein there is no communication among the plurality of die other than via the wireless communications links.

10. The microelectronic device of claim 9, wherein the transceiver circuitry on one or more of the plurality of die is configured to either transmit or receive radio frequency signals via the antenna.

11. The microelectronic device of claim 9, wherein the transceiver circuitry on one or more of the plurality of die is configured to both transmit and receive radio frequency signals via the antenna.

12. The microelectronic device of claim 9, wherein the processor is configured to receive data provided by the transceiver circuitry, and wherein the processor operates in a designed manner in response to the data provided by the transceiver circuitry.

13. The microelectronic device of claim 9, wherein the wireless communications links permit operating instructions for at least one of the processors to be transmitted and received.

14. The microelectronic device of claim 9 wherein the cellular phone housing is handheld.

15. The microelectronic device of claim 9 wherein the cellular phone housing is formed from plastic.

16. A method of operating a microelectronic device, the method comprising:
establishing a wireless communications link between an integrated circuit transmitter on a first die and an integrated circuit receiver on a second die, wherein the first and second die are mounted within a cellular phone housing, wherein electronic connections between the first and second die and the substrate are power connections only;
transmitting operating instructions by the integrated circuit transmitter on the first die; and
receiving the operating instructions at the integrated circuit receiver on the second die to operate additional integrated circuitry on the second die.

17. The method of claim 16, further comprising:
providing power to the first die via electro-physical connections that are used to mount the first die to a substrate within the cellular phone housing.

18. The method of claim 16, wherein the cellular phone housing is sized to be hand-transportable.

19. The method of claim 16, wherein the integrated circuit transmitter is coupled to a first antenna, and the integrated circuit receiver is coupled to a second antenna; and wherein the first antenna is mounted within the cellular phone housing within 24 inches of the second antenna.

20. The method of claim 16, wherein the integrated circuit transmitter is coupled to a first antenna, and the integrated circuit receiver is coupled to a second antenna; and wherein the first antenna is mounted within the cellular phone housing within one inch of the second antenna.

21. The method of claim 16, wherein the integrated circuit transmitter is coupled to a first antenna, and the integrated circuit receiver is coupled to a second antenna; and wherein the first antenna is mounted within the cellular phone housing within one-half inch of the second antenna.

22. An apparatus, comprising:
first integrated circuitry mounted on a substrate within a cellular phone housing, the first integrated circuitry comprising first transmit circuitry configured to transmit radio frequency signals via a first antenna;
second integrated circuitry mounted on the substrate within the cellular phone housing, the second integrated circuitry comprising second receive circuitry configured to receive radio frequency signals via a second antenna;
wherein the first transmit circuitry and the second receive circuitry are configured to establish a wireless communications link between the first and second integrated circuitry, and wherein there is no communication from the first integrated circuitry to the second integrated other than via a wireless communications link;
wherein electronic connections between the first and second die and the substrate are power connections only.

23. The apparatus of claim 22, wherein the cellular phone housing is hand-transportable.

24. The apparatus of claim 22, wherein the first transmit circuitry is configured to wireless transmit operating instructions to the second receive circuitry to operate a portion of the second integrated circuitry.

25. The apparatus of claim 22 wherein the cellular phone housing is formed from plastic.

26. A method comprising:
establishing a wireless communications link between an integrated circuit transmitter on a first die and an integrated circuit receiver on a second die, wherein the first and second die are mounted within a microelectronic package, wherein electro-physical connections between the first die and the second die are power connections only;
transmitting signals by the integrated circuit transmitter on the first die; and
receiving the signals at the integrated circuit receiver on the second die.

27. The method of claim 26, further comprising:
providing power to the first die via the electro-physical connections, the electro-physical connections used to mount the first die to a substrate within the microelectronic package.

28. The method of claim 26, wherein the microelectronic package is sized to be hand-transportable.

29. The method of claim 26, wherein the integrated circuit transmitter is coupled to a first antenna, and the integrated circuit receiver is coupled to a second antenna; and wherein the first antenna is mounted within the microelectronic package within 24 inches of the second antenna.

30. The method of claim 26, wherein the integrated circuit transmitter is coupled to a first antenna, and the integrated circuit receiver is coupled to a second antenna; and wherein the first antenna is mounted within the microelectronic package within one inch of the second antenna.

31. The method of claim 26, wherein the integrated circuit transmitter is coupled to a first antenna, and the integrated circuit receiver is coupled to a second antenna; and wherein the first antenna is mounted within the microelectronic package within one-half inch of the second antenna.

32. The method of claim 26, wherein a processor is formed in each of the first die and the second die.

33. The method of claim 26 wherein the microelectronic package is a cellular phone housing.

34. The method of claim 26 wherein the microelectronic package is formed from plastic.

* * * * *

UNITED STATES PATENT AND TRADEMARK OFFICE
CERTIFICATE OF CORRECTION

| | | |
|---|---|---|
| PATENT NO. | : 7,778,621 B2 | |
| APPLICATION NO. | : 11/847645 | |
| DATED | : August 17, 2010 | |
| INVENTOR(S) | : Patrick W. Tandy | |

It is certified that error appears in the above-identified patent and that said Letters Patent is hereby corrected as shown below:

Column 1, line 32, "circuitry device," should read --circuitry devices--.
Column 3, line 20, "respectively, comprise" should read --respectively comprises--.
Column 4, line 1, "but need not" should read --but need not,--.
Column 4, line 5, "but need not" should read --but need not,--.
Column 4, line 29, "because now," should read --because now--.
Column 6, line 20, "number wire" should read --number of wire--.
Column 8, line 35, "second integrated" should read --second integrated circuitry--.

Signed and Sealed this
Fourth Day of October, 2011

David J. Kappos
*Director of the United States Patent and Trademark Office*